United States Patent
Tsai

(10) Patent No.: US 7,173,259 B2
(45) Date of Patent: Feb. 6, 2007

(54) AUTOMATICALLY ALIGNING OBJECTIVE APERTURE FOR A SCANNING ELECTRON MICROSCOPE

(75) Inventor: Yi-Chang Tsai, Bao Shan Township (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 221 days.

(21) Appl. No.: 10/864,709

(22) Filed: Jun. 9, 2004

(65) Prior Publication Data

US 2005/0274908 A1  Dec. 15, 2005

(51) Int. Cl.
*H01J 49/00* (2006.01)
*G02B 7/04* (2006.01)
*G01N 23/225* (2006.01)

(52) U.S. Cl. .................. 250/491.1; 250/310; 250/311; 250/252.1

(58) Field of Classification Search ............. 250/491.1, 250/310–311, 305–307, 252.1, 201.3, 201.2, 250/559.4, 559.44; 356/39, 244; 382/206, 382/181
See application file for complete search history.

(56) References Cited

U.S. PATENT DOCUMENTS

| | | | |
|---|---|---|---|
| 5,731,580 A * | 3/1998 | Sato et al. ................. 250/310 |
| 6,114,681 A | 9/2000 | Komatsu | |
| 6,114,682 A * | 9/2000 | Minakuchi et al. ......... 250/205 |
| 6,384,408 B1 * | 5/2002 | Yee et al. ................ 250/252.1 |
| 6,838,667 B2 * | 1/2005 | Tsuneta et al. ............. 250/306 |
| 2002/0056808 A1 * | 5/2002 | Tsuneta et al. ............. 250/306 |
| 2002/0079448 A1 * | 6/2002 | Ishitani et al. ............. 250/310 |
| 2002/0148961 A1 * | 10/2002 | Nakasuji et al. ............ 250/311 |
| 2003/0155509 A1 * | 8/2003 | Nakasuji et al. ............ 250/310 |
| 2004/0135083 A1 * | 7/2004 | Kakibayashi et al. ....... 250/307 |
| 2004/0173747 A1 * | 9/2004 | Dean et al. ................ 250/310 |
| 2005/0274908 A1 * | 12/2005 | Tsai ........................ 250/491.1 |

\* cited by examiner

*Primary Examiner*—Nikita Wells
*Assistant Examiner*—Bernard E. Souw
(74) *Attorney, Agent, or Firm*—Duane Morris LLP

(57) ABSTRACT

An automatically aligning objective aperture assembly for a CDSEM includes a plate that is moveable in X and Y directions relative to an electron beam generated by the SEM. The plate defines one or more objective apertures. Encoders and motors are provided for affecting movement of the plate in the X and Y directions. An image controller, responsive to an image of a semiconductor wafer feature focused upon by the electron beam, controls the encoders and motors in a manner which affects movement of the plate to automatically align the objective aperture with the electron beam.

14 Claims, 7 Drawing Sheets

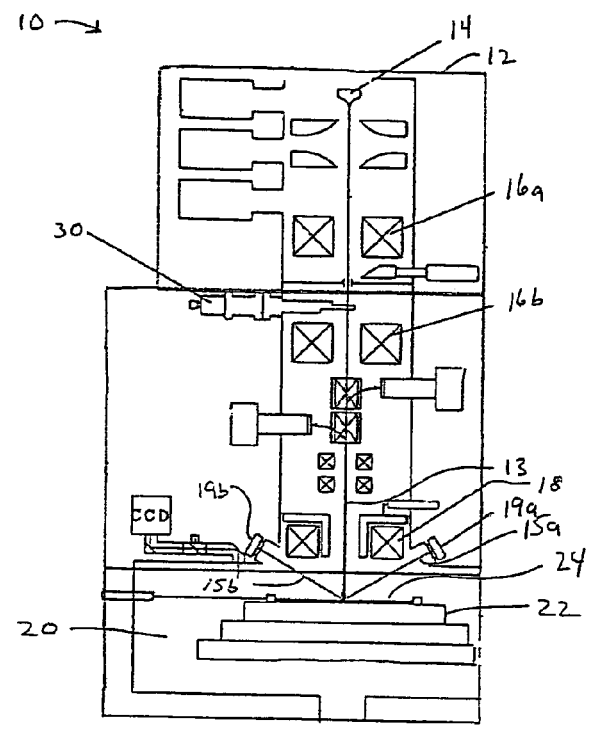
Fig. 1
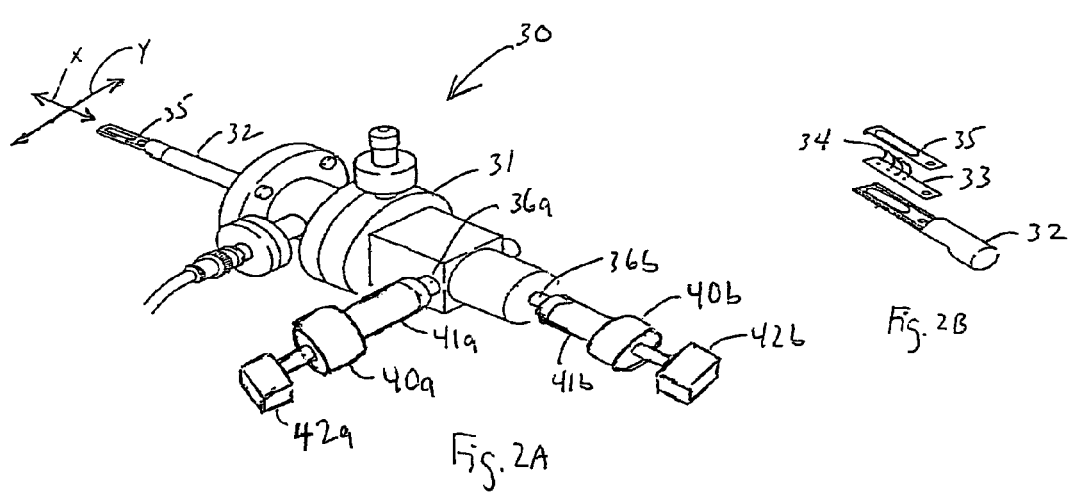
Fig. 2A
Fig. 2B

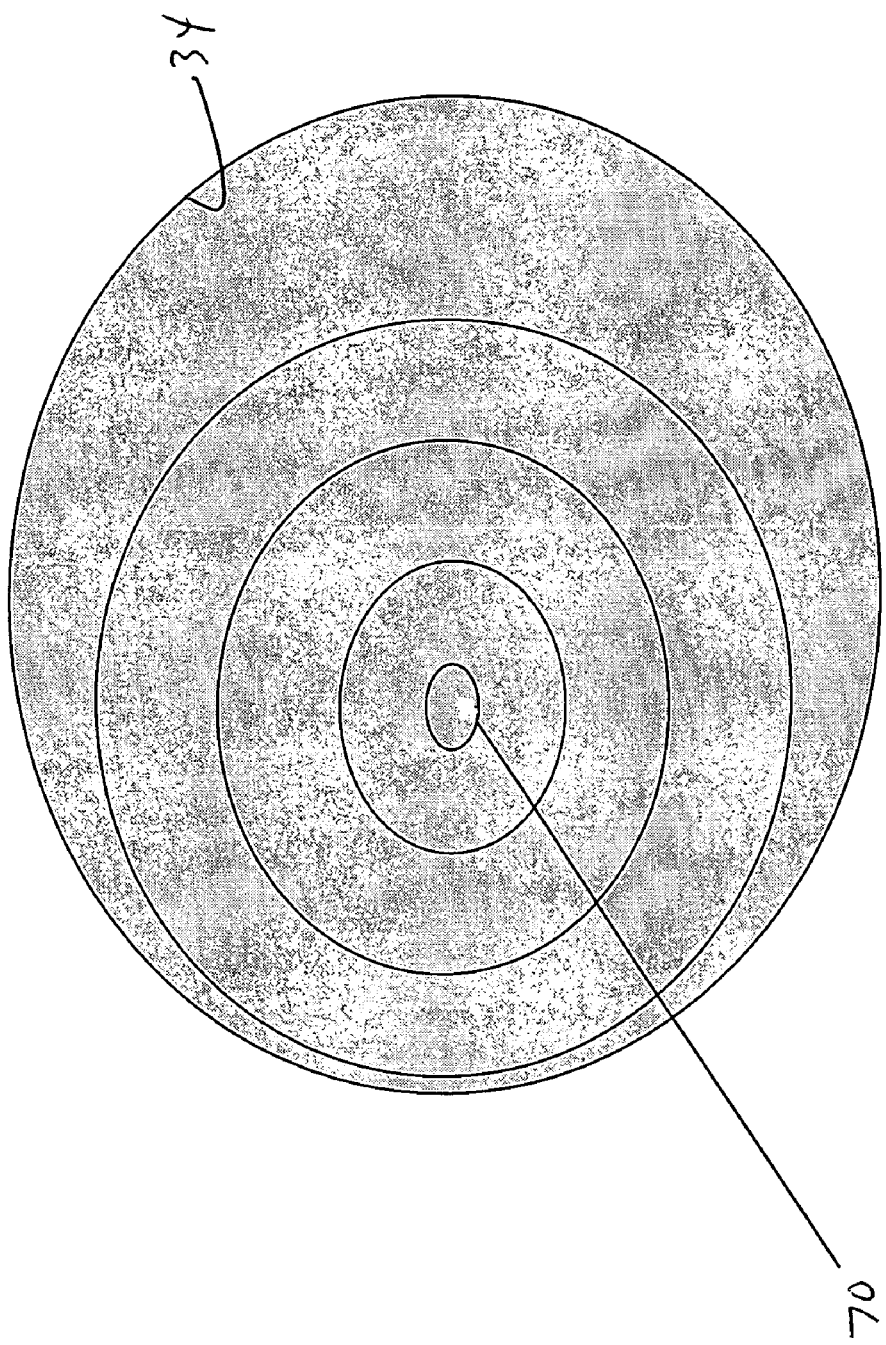

AUTOMATICALLY ALIGNING OBJECTIVE APERTURE FOR A SCANNING ELECTRON MICROSCOPE

FIELD OF THE INVENTION

The present invention relates to a scanning electron microscope. More particularly the present invention relates to an objective aperture assembly for a critical dimension scanning electron microscope, the objective aperture assembly having an automatically aligning objective aperture.

BACKGROUND OF THE INVENTION

It is important to measure and control the feature size of various patterns during the fabrication of semiconductors. Such a measurement is commonly known in the art as a critical dimension (CD) measurement. A critical dimension scanning electron microscope (CDSEM) is typically utilized for CD measurement of semiconductor features.

A CDSEM operates by focussing of an electron beam onto a semiconductor wafer or substrate. Backscattered and secondary electrons are generated by the electron beam and collected for measurement purposes. Scanning the electron beam across a feature of interest and detecting the backscattered and secondary electrons allows CD measurement of the feature.

Production line operators are typically instructed how to operate the CDSEM so that they may accurately perform CD measurements during various stages of semiconductor fabrication. Because the accuracy of a CD measurement depends upon how accurately the electron beam of the CDSEM is focussed onto the feature of interest on the semiconductor wafer, an emphasis is placed during instruction on how to properly focus the electron beam.

The procedure for focussing the electron beam of the CDSEM generally involves three basic steps: objective aperture alignment, focus adjustment, and astigmatism adjustment. Objective aperture alignment is especially critical because if the objective aperture is not aligned, the image of the feature will move across the display screen during focussing. The objective aperture is typically aligned by focussing the electron beam on a circular feature on a fiducial mark. If the central axis of the aperture is not aligned with the condenser lens of the CDSEM, the image of the feature will move across the display screen during focussing, as stated earlier. The central axis of the aperture may be aligned with the condenser lens using manually adjustable controls that move the aperture in the X and Y directions. The manual controls are adjusted so that the feature stays in about the same area of the display screen during focusing. When this is accomplished, the aperture is considered to be properly aligned.

Once the aperture alignment has been correctly adjusted, the CDSEM may be operated for many months by merely adjusting electron beam focus and astigmatism. Over time, however, the aperture tends to degrade thereby making proper focus and astigmatism adjustment difficult for the operator. When this occurs, the aperture must be changed and then properly aligned. Since the task of changing and aligning the new aperture is typically not released to the operator of the CDSEM, an equipment engineer must be called to change the aperture and align it manually. The down time resulting from this reduces critical dimension measurement throughput and effectively increases the measuring time per wafer.

SUMMARY OF THE INVENTION

An automatically aligning objective aperture assembly for a CDSEM is disclosed for an SEM. The automatically aligning objective aperture assembly includes a plate that is moveable in X and Y directions relative to an electron beam generated by the SEM. The plate defines one or more objective apertures. Motors are provided for affecting movement of the plate in the X and Y directions. An image controller, responsive to an image of a semiconductor wafer feature focused upon by the electron beam, controls the motors in a manner which affects movement of the plate to automatically align the objective aperture with the electron beam.

BRIEF DESCRIPTION OF THE DRAWINGS

FIG. 1 is an illustration of a CDSEM according to an embodiment of the present invention.

FIG. 2A is a perspective view of an aperture assembly having an automatically aligning objective aperture according to an exemplary embodiment of the present invention.

FIG. 2B is an exploded view of an aperture holder, an aperture plate, and aperture support of the aperture assembly of FIG. 2A.

FIGS. 6A–6C illustrate aperture detector maps for adjusting aperture focus to align the image point on a center of a circle, wherein the aperture detector map of FIG. 6A illustrates a focus center for an aligned aperture position, the aperture detector map of FIG. 6B illustrates a focus center for an X-axis shifted aperture position, and the aperture detector map of FIG. 6C illustrates a focus center for a Y-axis shifted aperture position.

DETAILED DESCRIPTION OF THE INVENTION

Figure 3:
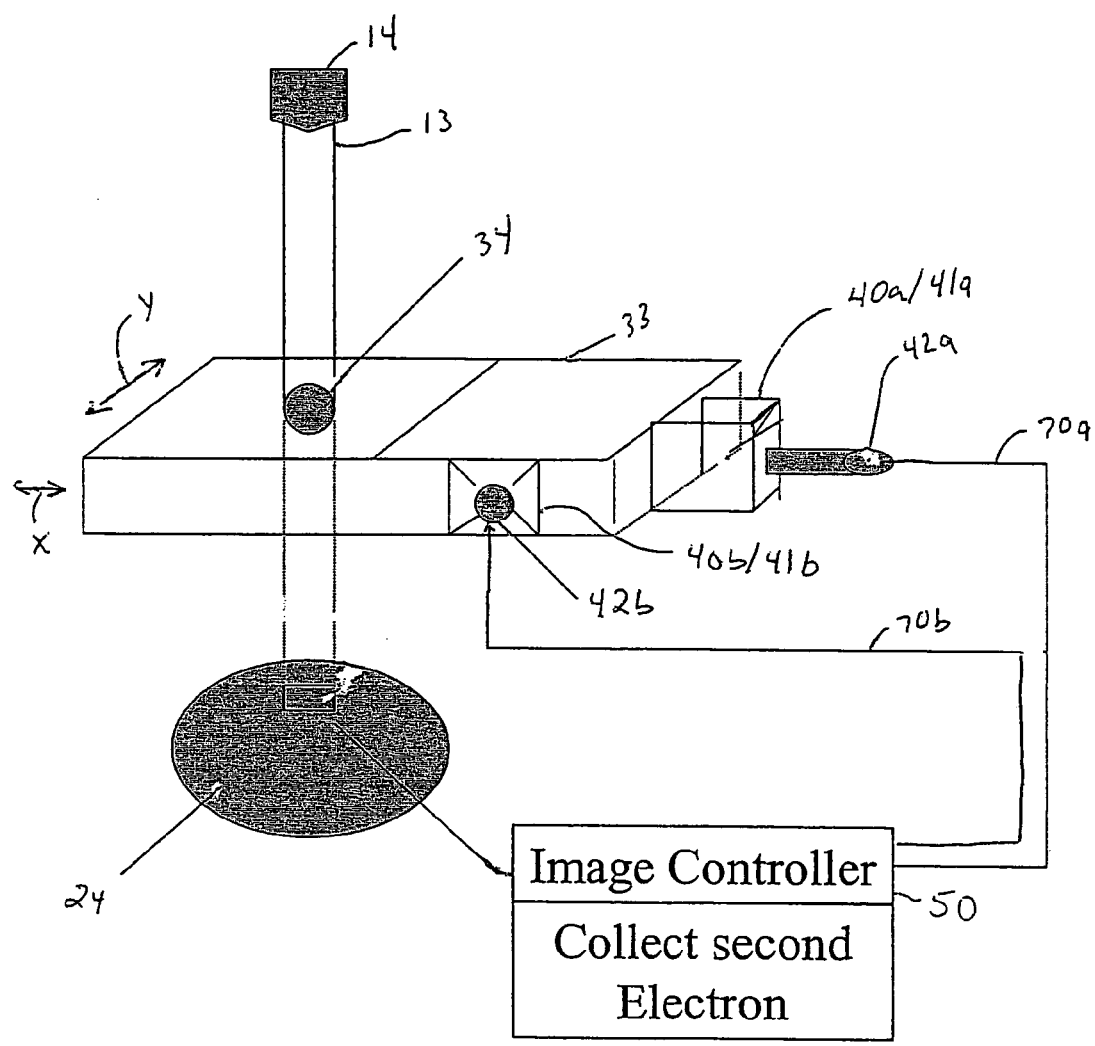
FIG. 3 is a functional illustration of the aperture assembly of FIG. 2A.

A CDSEM according to an exemplary embodiment of the present is shown in FIG. 1 and denoted by reference numeral 10. As can be seen, electron gun 12 having electron source 14 directs electron beam 13 into sample chamber 20 containing XY wafer mounting stage 22 which mounts wafer 24. The electron beam 13 is focussed onto wafer 24 by CDSEM components including first condenser lens 16a, aperture assembly 30 having an automatically aligning objective aperture, second condenser lens 16b, and objective lens 18. Collected from wafer 24 are beams 15a and 15b of backscattered and secondary electrons which are detected by detectors 19a and 19b. A computer (not shown) performs imaging analysis for CD measurement and a display screen (not shown) allows image data to be viewed by an operator.

FIGS. 2A and 2B collectively show an exemplary embodiment of the aperture assembly 30 having the automatically aligning objective aperture. As shown, the aperture assembly 30 may include a main body 31, a rod-like aperture holder 32 extending from within the main body 31 which mounts on a free end thereof an aperture plate 33 defining one or more objective apertures 34, typically of the same diameter. The aperture plate 33 may be retained on the free end of the aperture holder 32 by an aperture support 35. Adjustment knobs 36a and 36b or like devices are provided for manually moving the rod-like aperture holder 32 (and therefore the aperture plate 33) respectively along X and Y axes.

In one exemplary embodiment of the invention, automatic alignment of the one or more objective apertures 34 may be achieved by providing an X stepper motor 40a that is attached to X axis adjustment knob 36a by coupling 41a, and providing a Y stepper motor 40b that is attached to Y direction adjustment knob 36b by coupling 41b. As shown in FIG. 3, image controller(FIG. 3), which may be integrated with the earlier mentioned computer, actuates X stepper motor 40a using X encoder 42a and actuates Y stepper motor 40b using Y encoder 42b.

Figure 4:
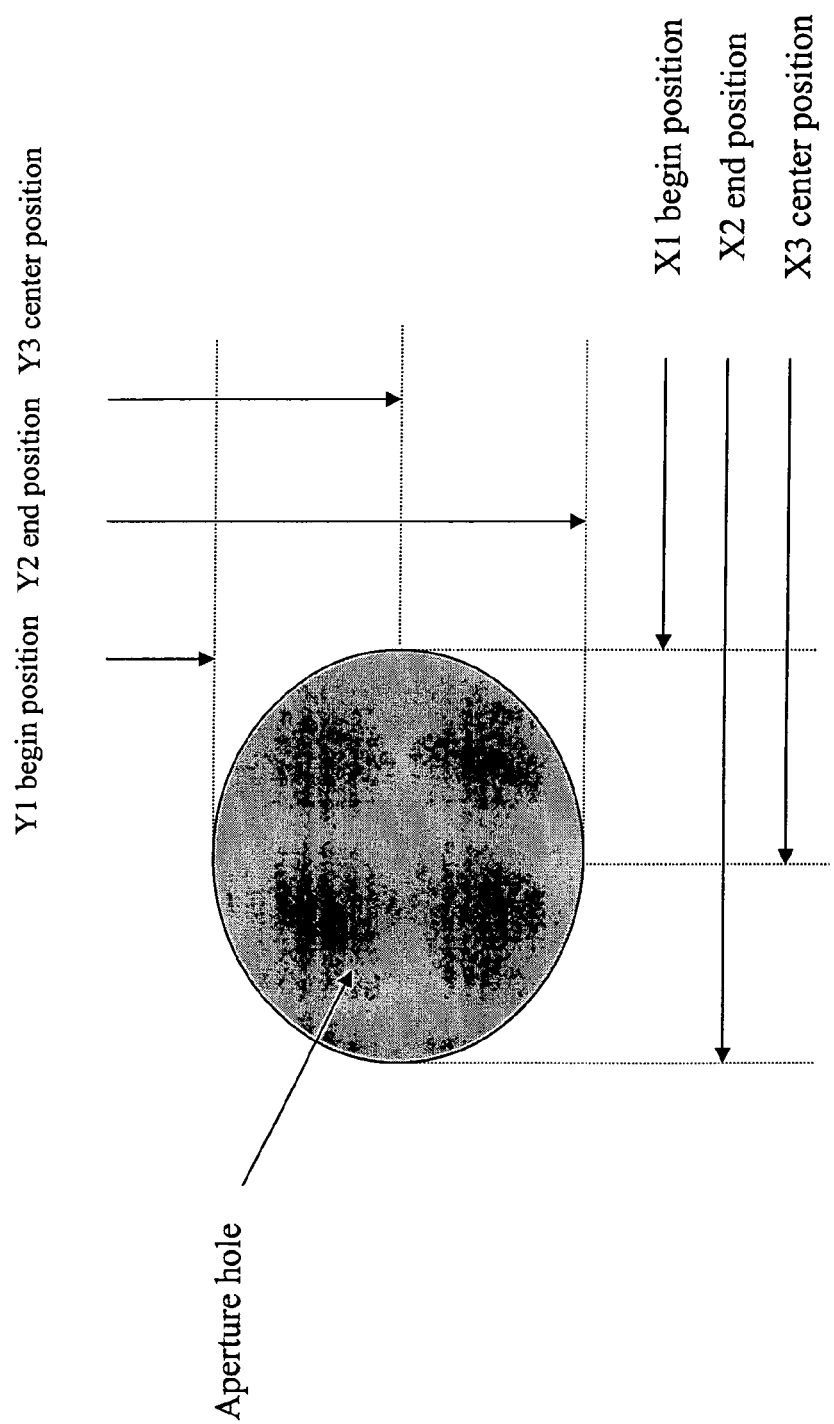
FIG. 4 is an illustration depicting the operation of the automatically aligning objective aperture of the aperture assembly.
Figure 6A:
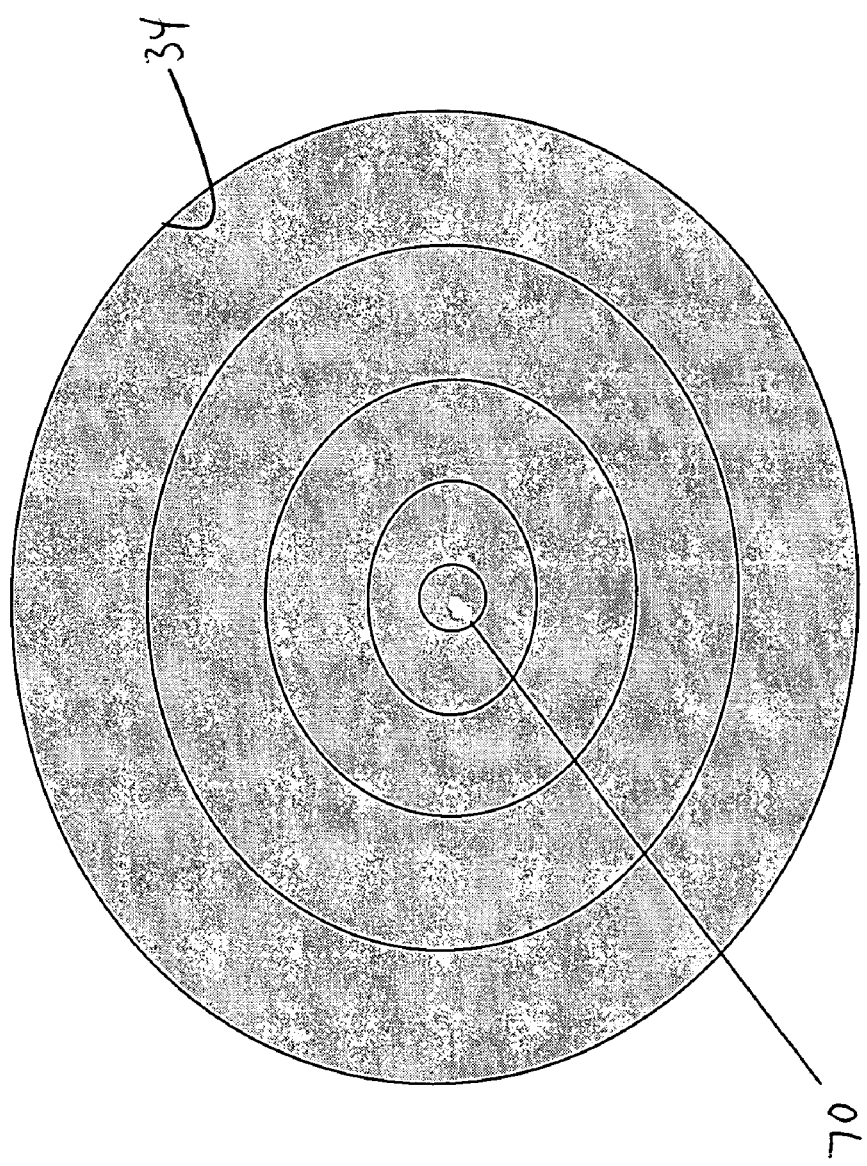
Figure 6C:
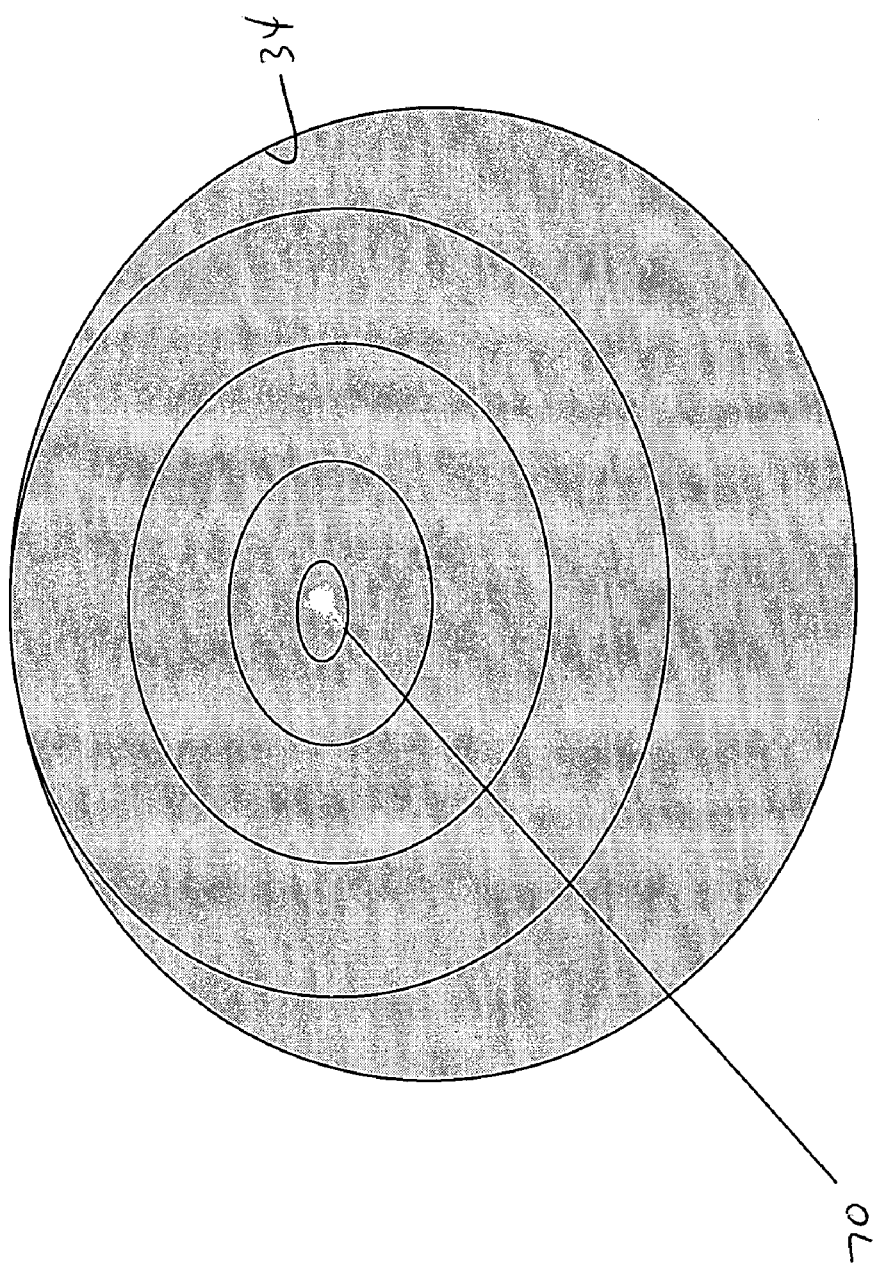

Referring to FIG. 4, the automatically aligning objective aperture 34 of the objective aperture assembly 30 operates as follows. The CDSEM is activated to focus an electron beam 13 onto a feature of semiconductor wafer 24 mounted on wafer mounting stage 22. The feature (denoted by numeral 70 in FIGS. 6A–6C) selected for performing automatic objective alignment is typically circular in shape. To align the X-axis position of one of the selected objective apertures 34, the image controller 50 generates a first X-axis feedback 70a signal which is applied to X encoder 42a. The X encoder 42a, in turn, activates X motor 40a with an appropriate electrical pulse. Activated X motor 40a rotates X-axis control knob 36a of aperture assembly 30 using coupling 41a, thereby moving the aperture plate 33 in the appropriate direction along the X-axis until beginning edge position X1 of aperture 34 is detected in the image. The image controller 50 generates a second X-axis feedback signal 70a which causes the aperture plate 33 to move (via the X encoder 42a, X motor 40a, coupling 41a, and X-axis control knob 36a as described above) in the appropriate direction along the X axis until end edge position X2 of aperture 34 is detected in the image. The image controller 50 then uses the beginning and end aperture edge positions X1 and X2 respectively, to identify the X-axis center X3 of aperture 34 according to the following relationship:

$$X3=(X1+X2)/2$$

The image controller 50 then generates a third X-axis feedback signal 70a which cause the aperture plate 33 to move (via the X encoder 42a, X motor 40a, coupling 41a, and X-axis control knob 36a as described above) in the appropriate direction along the X axis to the calculated X-axis center position X3.

To align the Y-axis position of objective aperture 34, the image controller 50 generates a first Y-axis feedback signal 70b which is applied to Y encoder 42b. The Y encoder 42b, in turn, activates Y motor 40b with an appropriate electrical pulse. Activated Y motor 40b rotates Y-axis control knob 36b of aperture assembly 30 using coupling 41b, thereby moving the aperture plate 33 in the appropriate direction along the Y axis until beginning edge position Y1 of aperture 34 is detected in the image. The image controller 50 generates a second Y-axis feedback signal 70b which causes the aperture plate 33 to move (via the Y encoder 42b, Y motor 40b, coupling 41b, and Y-axis control knob 36b as describe above) in the appropriate direction along the Y-axis until end edge position Y2 of aperture 34 is detected in the image. The image controller 50 then uses the beginning aperture edge position Y1 and the end aperture edge position Y2 to identify the Y-axis center Y3 of aperture 34 according to the following relationship:

$$Y3=(Y1+Y2)/2$$

The image controller 50 then generates a third Y-axis feedback signal 70b which cause the aperture plate 33 to move (via the Y encoder 42b, Y motor 40b, coupling 41b, and Y-axis control knob 36b as described above) in the appropriate direction along the Y axis to the calculated Y-axis center position Y3.

Figure 5:
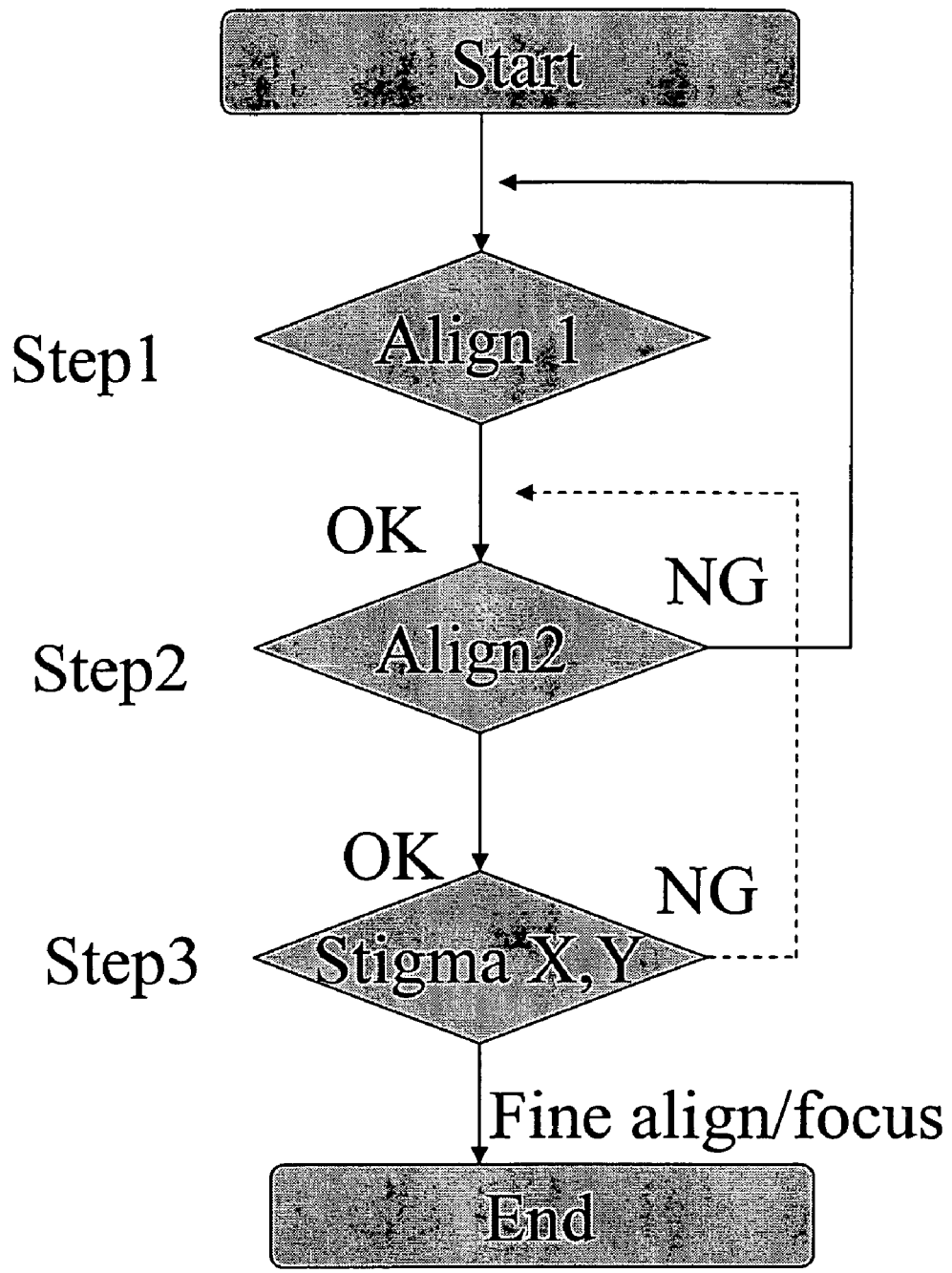
FIG. 5 is a flowchart depicting the steps performed to measure a critical dimension of a semiconductor wafer feature using the CDSEM and the automatically aligning objective aperture of the aperture assembly.

FIG. 5 is a flowchart depicting the steps performed to measure a critical dimension (CD) of a semiconductor wafer feature (the feature shown in FIGS. 6A–6C for aperture aligning) using a CDSEM comprising an aperture assembly 30 having the automatically aligning objective aperture of the invention. The steps for CD measurement include: step 1, the automatic objective alignment method of the invention; step 2, conventional rough focus adjustment; and step 3, conventional fine focus adjustment (astigmatism adjustment). Note that once the objective aperture has been correctly aligned, CD measurements can be taken for many months by merely performing the rough focus adjustment of step 2 and the astigmatism adjustment of step 3. Over time, however, the objective aperture tends to degrade thereby making rough focus and astigmatism adjustment difficult for the operator, as the image of feature will tend to move across and/or off the display screen during focussing. When this occurs, the operator must change the objective aperture and perform step 1 according to the earlier described method to properly align the new objective aperture. Once step 1 has been performed, the rough focus method of step 2 is performed. If image of the feature still moves across and/or off the display screen during rough focussing, the objective aperture may have to be aligned again by repeating the automatic objective aperture alignment method of step 1. After rough focus has been achieved, fine focussing or astigmatism adjustment is performed. If a fine focus is not achieved, it may be necessary to repeat step 2 and then perform step 3 again. Once a fine focus image of the feature is achieved, it may be saved to the image controller 50.

While the foregoing invention has been described with reference to the above, various modifications and changes can be made without departing from the spirit of the invention. Accordingly, all such modifications and changes are considered to be within the scope of the appended claims.

What is claimed is:

1. An apparatus for automatically aligning an objective aperture of a scanning electron microscope (SEM), the objective aperture formed in a plate that is moveable relative to an electron beam generated by the SEM, the apparatus comprising:

at least one motor for affecting movement of the plate;

an image controller, responsive to an image of a semiconductor wafer feature focused upon by the electron beam, for causing the at least one motor to affect movement of the plate to automatically align the objective aperture with the electron beam;

wherein the plate is retained on a holder which is movable via a manual adjustment member, the at least one motor affecting movement of the plate via the manual adjustment member.

2. The apparatus according to claim 1, further comprising at least one encoder responsive to a feedback signal received from the image controller, for applying an electrical pulse to the at least one motor to cause the at least one motor to affect movement of the plate.

3. An apparatus for automatically aligning an objective aperture of a scanning electron microscope (SEM), the objective aperture formed in a plate that is moveable relative to an electron beam generated by the SEM, the apparatus comprising:
   a first motor for affecting movement of the plate in a first direction;
   a second motor for affecting movement of the plate in a second direction;
   an image controller, responsive to an image of a semiconductor wafer feature focused upon by the electron beam, for causing the first and second motors to affect movement of the plate in the first and second directions to automatically align the objective aperture with the electron beam;
   a holder for retaining the plate; and
   a manual adjustment member for manually moving the plate,
   wherein one of the first and second motors affects movement of the plate via the first manual adjustment member.

4. The apparatus according to claim 3, wherein the other one of the first and second motors affecting movement of the plate via another manual adjustment member.

5. The apparatus according to claim 3, further comprising first and second encoders responsive to feedback signals received from the image controller, for applying electrical pulses to respective ones of the first and second motors to cause the first and second motors to affect movement of the plate in the first and second directions.

6. The apparatus according to claim 5, wherein the image controller generates some of the feedback signals in response to edge positions of the aperture detected in the image.

7. The apparatus according to claim 6, wherein the image controller calculates an aligned position of the aperture from the edge positions and generates the remaining ones of the feedback signals in response to the calculated aligned position.

8. An objective aperture assembly for a scanning electron microscope (SEM), the objective aperture assembly comprising:
   a plate having at least one objective aperture formed therethrough, the plate being moveable relative to an electron beam generated by the SEM;
   at least one motor for affecting movement of the plate;
   an image controller, responsive to an image of a semiconductor wafer feature focused upon by the electron beam, for causing the at least one motor to affect movement of the plate to automatically align the objective aperture with the electron beam;
   a holder for retaining the plate; and
   a manual adjustment member for moving the holder;
   wherein the at least one motor affecting movement of the plate via the manual adjustment member.

9. The assembly according to claim 8, further comprising at least one encoder responsive to a feedback signal received from the image controller, for applying an electrical pulse to the at least one motor to cause the at least one motor to affect movement of the plate.

10. An objective aperture assembly for a scanning electron microscope (SEM), the objective aperture assembly comprising:
    a plate having at least one objective aperture formed therethrough, the plate being moveable relative to an electron beam generated by the SEM;
    a first motor for affecting movement of the plate in a first direction;
    a second motor for affecting movement of the plate in a second direction;
    an image controller, responsive to an image of a semiconductor wafer feature focused upon by the electron beam, for causing the first and second motors to affect movement of the plate in the first and second directions to automatically align the objective aperture with the electron beam;
    a holder for retaining the plate; and
    a first manual adjustment member for manually moving the plate,
    wherein one of the first and second motors affects movement of the plate via the first manual adjustment member.

11. The assembly according to claim 10, wherein the first manual adjustment member is for manually moving the plate in the first direction and further comprising:
    a second manual adjustment member for manually moving the plate in the second direction;
    wherein the first motor affecting movement of the plate in the first direction via the first manual adjustment member and the second motor affecting movement of the plate in the second direction via the second manual adjustment member.

12. The assembly according to claim 10, further comprising first and second encoders responsive to feedback signals received from the image controller, for applying electrical pulses to respective ones of the first and second motors to cause the first and second motors to affect movement of the plate in the first and second directions.

13. The assembly according to claim 12, wherein the image controller generates some of the feedback signals in response to edge positions of the aperture detected in the image.

14. The assembly according to claim 13, wherein the image controller calculates an aligned position of the aperture from the edge positions and generates the remaining ones of the feedback signals in response to the calculated aligned position.

* * * * *